(12) United States Patent
Vrtis et al.

(10) Patent No.: US 8,951,342 B2
(45) Date of Patent: *Feb. 10, 2015

(54) METHODS FOR USING POROGENS FOR LOW K POROUS ORGANOSILICA GLASS FILMS

(75) Inventors: Raymond Nicholas Vrtis, Orefield, PA (US); Mark Leonard O'Neill, San Marcos, CA (US); Jean Louise Vincent, Bethlehem, PA (US); Aaron Scott Lukas, Washington, DC (US); Mary Kathryn Haas, Emmaus, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 418 days.

This patent is subject to a terminal disclaimer.

(21) Appl. No.: 13/286,634

(22) Filed: Nov. 1, 2011

(65) Prior Publication Data

US 2012/0282415 A1 Nov. 8, 2012

Related U.S. Application Data

(63) Continuation-in-part of application No. 12/115,087, filed on May 5, 2008, now abandoned, and a continuation-in-part of application No. 10/409,468, filed on Apr. 7, 2003, now Pat. No. 7,384,471, and a (Continued)

(51) Int. Cl.
*C09D 7/12* (2006.01)
*C23C 16/40* (2006.01)
(Continued)

(52) U.S. Cl.
CPC .............. *C23C 16/401* (2013.01); *C23C 16/402* (2013.01); *H01L 21/02214* (2013.01);
(Continued)

(58) Field of Classification Search
USPC .............. 106/287.1, 287.13, 287.14, 287.16; 257/E21.273; 427/255.37, 532
See application file for complete search history.

(56) References Cited

U.S. PATENT DOCUMENTS

| 4,105,821 A | 8/1978 | Blaich et al. |
| 5,296,624 A | 3/1994 | Larson et al. |

(Continued)

FOREIGN PATENT DOCUMENTS

| EP | 1 037 275 A1 | 9/2000 |
| EP | 1077477 A1 | 2/2001 |

(Continued)

OTHER PUBLICATIONS

Grill, A., Ultralow-k dielectrics Prepared by Plasma-Enhanced Chemical Vapor Deposition, 2001 American Institute of Physics, Aug. 6, 2001, pp. 803-805, vol. 79, No. 6.

(Continued)

*Primary Examiner* — David M Brunsman
(74) *Attorney, Agent, or Firm* — Rosaleen P. Morris-Oskanian

(57) ABSTRACT

A chemical vapor deposition method for producing a porous organosilica glass film comprising: introducing into a vacuum chamber gaseous reagents including at least one precursor selected from the group consisting of an organosilane and an organosiloxane, and a porogen that is distinct from the precursor; applying energy to the gaseous reagents in the vacuum chamber to induce reaction of the gaseous reagents to deposit a preliminary film on the substrate, wherein the preliminary film contains the porogen; and removing from the preliminary film substantially all of the porogen to provide the porous film with pores and a dielectric constant less than 2.6.

23 Claims, 9 Drawing Sheets

Related U.S. Application Data continuation-in-part of application No. 10/150,798, filed on May 17, 2002, now Pat. No. 6,846,515.

(60) Provisional application No. 60/373,104, filed on Apr. 17, 2002.

(51) Int. Cl.

| | |
|---|---|
| *H01L 21/02* | (2006.01) |
| *H01L 21/316* | (2006.01) |
| *C23C 16/30* | (2006.01) |
| *C23C 16/56* | (2006.01) |
| *C03C 1/00* | (2006.01) |
| *C23C 30/00* | (2006.01) |

(52) U.S. Cl.
CPC ........ *H01L21/31695* (2013.01); *C09D 7/1233* (2013.01); *C23C 16/30* (2013.01); *C23C 16/56* (2013.01); *H01L 21/02126* (2013.01); *H01L 21/02203* (2013.01); *H01L 21/02208* (2013.01); *H01L 21/02216* (2013.01); *H01L 21/02274* (2013.01); *H01L 21/02348* (2013.01); *C03C 1/008* (2013.01); *C23C 30/00* (2013.01)
USPC .............. 106/287.1; 106/287.13; 106/287.16; 106/287.14; 257/E21.273; 427/255.37; 427/532

(56) References Cited

U.S. PATENT DOCUMENTS

| | | | |
|---|---|---|---|
| 6,054,206 | A | 4/2000 | Mountsier |
| 6,068,884 | A | 5/2000 | Rose et al. |
| 6,132,814 | A | 10/2000 | Livesay et al. |
| 6,171,945 | B1 | 1/2001 | Mandal et al. |
| 6,204,201 | B1 | 3/2001 | Ross |
| 6,207,555 | B1 | 3/2001 | Ross |
| 6,238,751 | B1 | 5/2001 | Mountsler |
| 6,312,793 | B1 | 11/2001 | Grill et al. |
| 6,387,824 | B1 | 5/2002 | Aoi |
| 6,583,048 | B1 | 6/2003 | Vincent et al. |
| 6,656,854 | B2 | 12/2003 | Miyano et al. |
| 6,716,770 | B2 | 4/2004 | O'Neill et al. |
| 6,790,789 | B2 | 9/2004 | Grill et al. |
| 6,846,515 | B2 * | 1/2005 | Vrtis et al. ............... 427/255.29 |
| 6,930,393 | B2 | 8/2005 | Hamada et al. |
| 7,049,247 | B2 | 5/2006 | Gates et al. |
| 7,056,560 | B2 | 6/2006 | Yim et al. |
| 7,056,839 | B2 | 6/2006 | Endo et al. |
| 7,332,455 | B2 * | 2/2008 | Wei et al. ...................... 502/120 |
| 7,357,961 | B2 | 4/2008 | Iwabuchi et al. |
| 7,359,357 | B2 | 4/2008 | Rhee et al. |
| 7,384,471 | B2 * | 6/2008 | Vrtis et al. ............... 106/287.14 |
| 7,456,488 | B2 | 11/2008 | Xu et al. |
| 7,468,290 | B2 * | 12/2008 | Lukas et al. .................... 438/99 |
| 7,754,330 | B2 | 7/2010 | Hamada et al. |
| 7,943,195 | B2 * | 5/2011 | Vrtis et al. ............... 427/255.29 |
| 8,293,001 | B2 * | 10/2012 | Vrtis et al. ............... 106/287.14 |
| 2002/0119676 | A1 | 8/2002 | Aoi |
| 2003/0078443 | A1 | 4/2003 | Lee et al. |
| 2003/0211728 | A1 | 11/2003 | Mandal |
| 2003/0232137 | A1 | 12/2003 | Vrtis et al. |
| 2004/0197474 | A1 | 10/2004 | Vrtis et al. |
| 2005/0048795 | A1 | 3/2005 | Ko et al. |
| 2006/0078676 | A1 | 4/2006 | Lukas et al. |
| 2007/0299239 | A1 | 12/2007 | Weigel et al. |

FOREIGN PATENT DOCUMENTS

| | | |
|---|---|---|
| EP | 1 119 035 A2 | 7/2001 |
| EP | 1225194 A2 | 7/2002 |
| EP | 1482550 | 12/2004 |
| JP | 19900064931 | 3/1990 |
| JP | 03265585 A | 11/1991 |
| JP | 10340899 A | 12/1998 |
| JP | 2000216153 A2 | 8/2000 |
| JP | 2000349084 A2 | 12/2000 |
| JP | 2001274153 A2 | 5/2001 |
| JP | 2001-274153 | 10/2001 |
| JP | 2001298023 A2 | 10/2001 |
| JP | 2003040998 A2 | 4/2002 |
| JP | 2002256434 A2 | 9/2002 |
| JP | 2004006822 A2 | 1/2004 |
| JP | 2004-534400 | 11/2004 |
| JP | 2004320005 A2 | 11/2004 |
| JP | 2008010877 A2 | 1/2008 |
| KR | 100494194 B1 | 6/2005 |
| TW | 540118 | 3/1990 |
| WO | 9921706 A1 | 5/1999 |
| WO | 00/24050 A1 | 4/2000 |
| WO | 0111204 A1 | 2/2001 |
| WO | 0129052 A1 | 4/2001 |
| WO | 0211204 A1 | 2/2002 |
| WO | 0243119 A2 | 5/2002 |
| WO | 03/005429 A1 | 1/2003 |
| WO | 2004083495 | 9/2004 |
| WO | 2005019303 A1 | 3/2005 |
| WO | 2005109484 A1 | 11/2005 |
| WO | 2007033075 A9 | 3/2007 |

OTHER PUBLICATIONS

Chattopadhyay, S., Electron Beam Modification of Thermoplastic Elastomeric Blends Made From Polyolefins, Journal of Materials Science 36, 2001, pp. 4323-4330, Kluwer Academic Publishers.

Kloster, G., Porosity Effect on Low-k Dielectric Film Strength and Interfacial Adhesion, Proceedings of IITC, Jun. 3-5, 2002.

Dixit, Girish, et al, "Film properties and integration performance of a nano-porous carbon doped oxide," Applied Materials Inc., Santa Clara, CA, USA, International Interconnect Technology Conference, Jun. 2004.

Grill, A., et al, "Novel Low-k dual-phase Materials Prepared by PECVD," Mat. Res. Soc. Symp. vol. 612, 2000, Materials Research Society, Yorktown Heights, NY.

Grill, A., et al, "SiOCH Dielectrics: From Low-K to ultralow-K by PECVD," Conference Proceedings ULSI XVII, 2002, Materials Research Society, Yorktown Heights, NY.

Grill, A., et al, "Low Dielectric constant SiOCH films as potential for interconnect dielectrics," Mat. Res. Soc. Symp. Proc., vol. 565, 1999, Materials Research Society, Yorktown Heights, NY.

W.R. Robinson, "The law of patents for useful inventions," 1890, p. 278.

* cited by examiner

METHODS FOR USING POROGENS FOR LOW K POROUS ORGANOSILICA GLASS FILMS

CROSS-REFERENCES TO RELATED APPLICATIONS

This application claims priority under 35 U.S.C. §119(e) to provisional U.S. Patent Application No. 60/373,104 filed Apr. 17, 2002, and is a continuation-in-part of U.S. patent application Ser. No. 12/115,087, filed on May 5, 2008, which, in turn, is a continuation-in-part of U.S. patent application Ser. No. 10/409,468, filed on Apr. 7, 2003, which, in turn, is a continuation-in-part of U.S. patent application Ser. No. 10/150,798 filed May 17, 2002, the entire disclosures of which are incorporated by reference herein.

BACKGROUND OF THE INVENTION

The present invention is directed to the field of low dielectric constant materials produced by chemical vapor deposition (CVD) methods. In particular, the present invention is directed to methods for making films of such materials and their use as insulating layers in electronic devices.

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. The value of C is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which the industry has attempted to produce silica-based CVD films with lower dielectric constants, the most successful being the doping of the insulating silicon oxide film with organic groups providing dielectric constants in the range of 2.7-3.5. This organosilica glass is typically deposited as a dense film (density ~1.5 g/cm$^3$) from an organosilicon precursor, such as a methylsilane or siloxane, and an oxidant, such as $O_2$ or $N_2O$. Organosilica glass will herein be referred to as OSG. As dielectric constant or "k" values drop below 2.7 with higher device densities and smaller dimensions, the industry has exhausted most of the suitable low k compositions for dense films and has turned to various porous materials for improved insulating properties.

The patents and applications which are known in the field of porous ILD by CVD methods include: EP 1 119 035 A2 and U.S. Pat. No. 6,171,945, which describe a process of depositing an OSG film from organosilicon precursors with labile groups in the presence of an oxidant such as $N_2O$ and optionally a peroxide, with subsequent removal of the labile group with a thermal anneal to provide porous OSG; U.S. Pat. Nos. 6,054,206 and 6,238,751, which teach the removal of essentially all organic groups from deposited OSG with an oxidizing anneal to obtain porous inorganic $SiO_2$; EP 1 037 275, which describes the deposition of an hydrogenated silicon carbide film which is transformed into porous inorganic $SiO_2$ by a subsequent treatment with an oxidizing plasma; and U.S. Pat. No. 6,312,793 B1, WO 00/24050, and a literature article Grill, A. Patel, V. Appl. Phys. Lett. (2001), 79(6), pp. 803-805, which all teach the co-deposition of a film from an organosilicon precursor and an organic compound, and subsequent thermal anneal to provide a multiphase OSG/organic film in which a portion of the polymerized organic component is retained. In these latter references the ultimate final compositions of the films indicate residual porogen and a high hydrocarbon film content (80-90 atomic %). It is preferable that the final film retain the $SiO_2$-like network, with substitution of a portion of oxygen atoms for organic groups.

All references disclosed herein are incorporated by reference herein in their entireties.

BRIEF SUMMARY OF THE INVENTION

A chemical vapor deposition method for producing a porous organosilica glass film represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, said method comprising: providing a substrate within a vacuum chamber; introducing into the vacuum chamber gaseous reagents including at least one precursor selected from the group consisting of an organosilane and an organosiloxane, and a porogen that is distinct from the precursor, represented by formula:

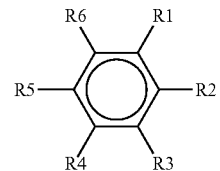

where R1-R6 are independently selected from the group consisting of: H; OH; $C_1$ to $C_6$ linear, branched, cyclic, saturated, singly or multiply unsaturated, hydrocarbon; or $C_1$ to $C_6$ linear, branched, cyclic, saturated or multiple unsaturated, ether, epoxide, alcohol, or ketone; applying energy to the gaseous reagents in the vacuum chamber to induce reaction of the gaseous reagents to deposit a preliminary film on the substrate, wherein the preliminary film contains the porogen; and removing from the preliminary film greater than 50% of the porogen to provide the porous film with pores and a dielectric constant less than 2.6.

In another aspect, the present invention provides a composition comprising: (a)(i) at least one precursor selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, and tetraethoxysilane, trimethylsilane, tetramethylsilane, methyltriacetoxysilane, methyldiacetoxysilane, methylethoxydisiloxane, tetramethylcyclotetrasiloxane, octamethylcyclotetrasiloxane, dim ethyldiacetoxysilane, bis(trimethoxysilyl)methane, bis(dimethoxysilyl)methane, tetraethoxysilane, triethoxysilane, and mixtures thereof; and (ii) a porogen distinct from the at least one precursor, wherein the porogen precursor is aromatic in nature, and represented by the formula:

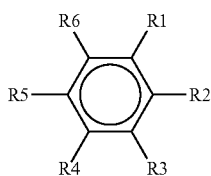

where R1-R6 are independently selected from the group consisting of: H; OH; $C_1$ to $C_6$ linear, branched, cyclic, saturated, singly or multiply unsaturated, hydrocarbon; or $C_1$ to $C_6$ linear, branched, cyclic, saturated or multiple unsaturated, ether, epoxide, alcohol, or ketone; applying energy to the gaseous reagents in the vacuum chamber to induce reaction of the gaseous reagents to deposit a preliminary film on the substrate, wherein the preliminary film contains the porogen; and removing from the preliminary film greater than 50% of the organic material to provide the porous film with pores and a dielectric constant less than 2.6.

The present invention provides porogen precursors that incorporate a high carbon content into the low k film while maintaining reasonable mechanical properties. This is accomplished through the incorporation of an amorphous type carbon, which may or may not be bound to the network or dispersed in the pore system, or combinations thereof. The amorphous type carbon may or may not be homogeneously distributed within the film. It is hypothesized that the higher carbon content of the ultra low dielectric (ULK) film will decrease the depth of damage that occurs during patterning steps, and provide a solution that is more readily integrated at smaller pattern dimensions.

DETAILED DESCRIPTION OF THE INVENTION

Figure 1:
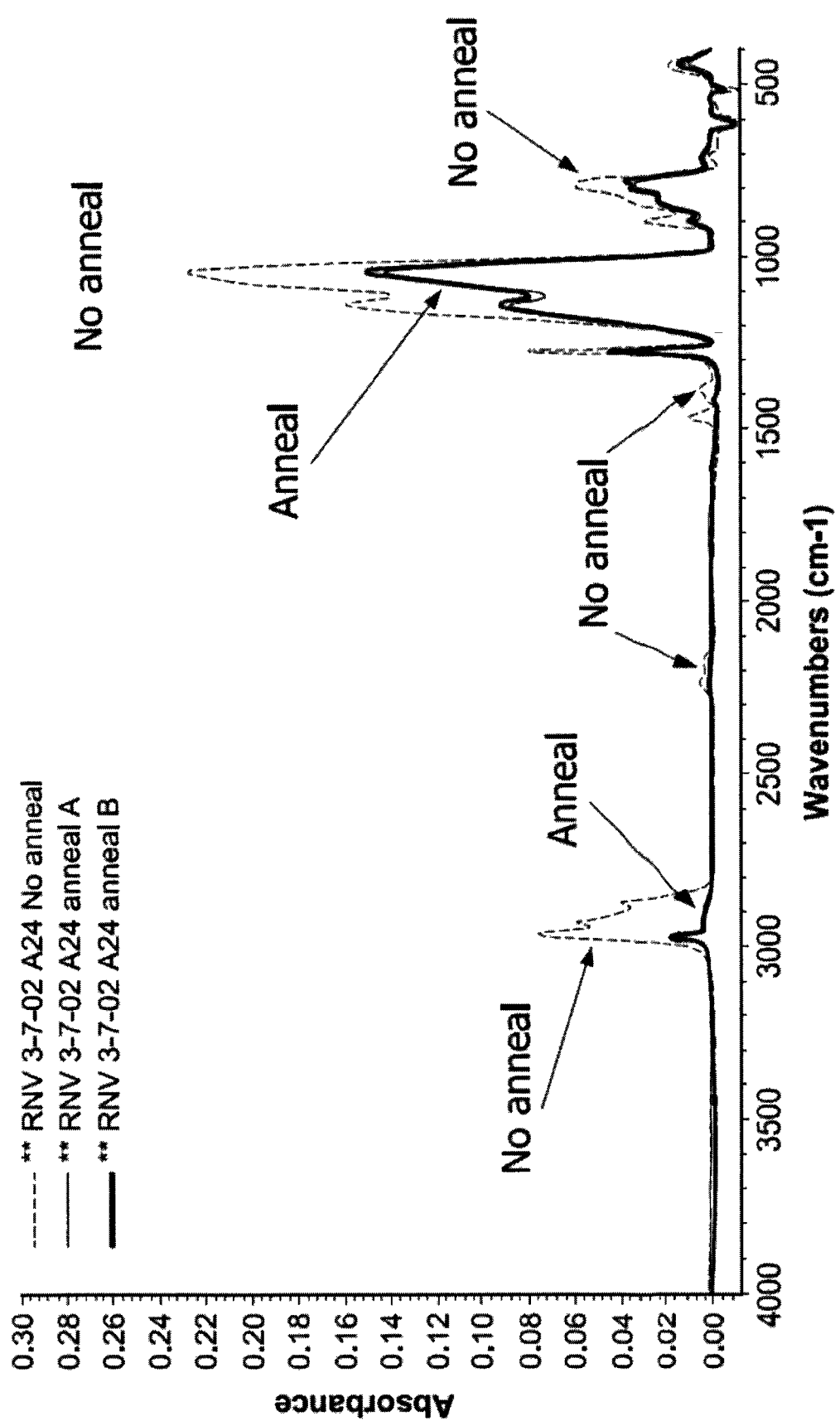
FIG. 1 shows infrared spectra of a film of the present invention using thermally labile group admixed therewith before and after a post anneal indicating the elimination of the thermally labile group.

Organosilicates are candidates for low k materials, but without the addition of porogens to add porosity to these materials, their inherent dielectric constant is limited to as low as 2.7. The addition of porosity, where the void space has an inherent dielectric constant of 1.0, reduces the overall dielectric constant of the film, generally at the cost of mechanical properties. Materials properties depend upon the chemical composition and structure of the film. Since the type of organosilicon precursor has a strong effect upon the film structure and composition, it is beneficial to use precursors that provide the required film properties to ensure that the addition of the needed amount of porosity to reach the desired dielectric constant does not produce films that are mechanically unsound. Thus, the invention provides the means to generate porous OSG films that have a desirable balance of electrical and mechanical properties. Other film properties often track with electrical or mechanical properties.

Preferred embodiments of the invention provide a thin film material having a low dielectric constant and improved mechanical properties, thermal stability, and chemical resistance (to oxygen, aqueous oxidizing environments, etc.) relative to other porous organosilica glass materials. This is the result of the incorporation into the film of carbon (preferably predominantly in the form of organic carbon, —$CH_x$, where x is 1 to 3, more preferably the majority of C is in the form of —$CH_3$) whereby specific precursor or network-forming chemicals are used to deposit films in an environment free of oxidants (other than the optional additive/carrier gas $CO_2$, to the extent it is deemed to function as an oxidant). It is also preferred that most of the hydrogen in the film is bonded to carbon.

The materials of the invention can be provided by adding pore-forming species or porogens to the deposition procedure, incorporating the porogens into the as-deposited (i.e., preliminary) OSG film and removing substantially the hydrocarbon porogen species from the preliminary film while substantially retaining the terminal Si—$CH_3$ groups of the preliminary film to provide the product film. The product film is porous OSG and has a dielectric constant reduced from that of the preliminary film as well as from an analogous film deposited without porogens. It is important to distinguish the film of the present invention as porous OSG, as opposed to a porous inorganic $SiO_2$, which lacks the hydrophobicity provided by the organic groups in OSG.

Silica produced by PE-CVD TEOS has an inherent free volume pore size determined by positron annihilation lifetime spectroscopy (PALS) analysis to be about 0.6 nm in equivalent spherical diameter. The pore size of the inventive films as determined by small angle neutron scattering (SANS) or PALS is preferably less than 5 nm in equivalent spherical diameter, more preferably less than 2.5 nm in equivalent spherical diameter.

Total porosity of the film may be from 5 to 75% depending upon the process conditions and the desired final film properties. Films of the invention preferably have a density of less than 2.0 $g/cm^3$, or alternatively, less than 1.5 $g/cm^3$ or less than 1.25 $g/cm^3$. Preferably, films of the invention have a density at least 10% less than that of an analogous OSG film produced without porogens, more preferably at least 20% less.

The porosity of the film need not be homogeneous throughout the film. In certain embodiments, there is a porosity gradient and/or layers of varying porosities. Such films can be provided by, e.g., adjusting the ratio of porogen to precursor during deposition.

Films of the invention have a lower dielectric constant relative to common OSG materials. Preferably, films of the invention have a dielectric constant at least 0.3 less than that of an analogous OSG film produced without porogens, more preferably at least 0.5 less. Preferably, an FTIR spectrum of a porous film of the invention is substantially identical to a reference FTIR of a reference film prepared by a process substantially identical to the method except for a lack of any porogen.

Films of the invention preferably have superior mechanical properties relative to common OSG materials. Preferably, the base OSG structure of the films of the invention (e.g., films that have not had any added porogen) has a hardness or modulus measured by nanoindentation at least 10% greater, more preferably 25% greater, than that of an analogous OSG film at the same dielectric constant.

Films of the invention do not require the use of an oxidant to deposit a low k film. The absence of added oxidant to the gas phase, which is defined for present purposes as a moiety that could oxidize organic groups (e.g., $O_2$, $N_2O$, ozone, hydrogen peroxide, NO, $NO_2$, $N_2O_4$, or mixtures thereof), facilitates the retention of the methyl groups of the precursor in the film. This allows the incorporation of the minimum amount of carbon necessary to provide desired properties, such as reduced dielectric constant and hydrophobicity. As well, this tends to provide maximum retention of the silica network, providing films that have superior mechanical properties, adhesion, and etch selectivity to common etch stop materials (e.g., silicon carbide, hydrogenated silicon carbide, silicon nitride, hydrogenated silicon nitride, etc.), since the film retains characteristics more similar to silica, the traditional dielectric insulator.

Films of the invention may also optionally contain fluorine, in the form of inorganic fluorine (e.g., Si—F). Fluorine, when present, is preferably contained in an amount ranging from 0.5 to 7 atomic %.

Films of the invention are thermally stable, with good chemical resistance. In particular, preferred films after anneal have an average weight loss of less than 1.0 wt %/hr isothermal at 425° C. under $N_2$. Moreover, the films preferably have an average weight loss of less than 1.0 wt %/hr isothermal at 425° C. under air.

The films are suitable for a variety of uses. The films are particularly suitable for deposition on a semiconductor substrate, and are particularly suitable for use as, e.g., an insulation layer, an interlayer dielectric layer and/or an intermetal dielectric layer. The films can form a conformal coating. The mechanical properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, fluorosilicon glass (FSG), silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N, TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film Thus in certain embodiments, the film is an insulation layer, an interlayer dielectric layer, an intermetal dielectric layer, a capping layer, a chemical-mechanical planarization or etch stop layer, a barrier layer or an adhesion layer in an integrated circuit.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits. Preferably, the substrate is a semiconductor.

In addition to the inventive OSG products, the present invention includes the process by which the products are made, methods of using the products and compounds and compositions useful for preparing the products.

The porogen in the deposited film may or may not be in the same form as the porogens precursor introduced to the reaction chamber. As well, the porogen removal process may liberate the porogen or fragments thereof from the film. In essence, the porogen reagent, the porogen in the preliminary film, and the porogen being removed may or may not be the same species, although it is preferable that they all originate from the porogen reagent. Regardless of whether or not the porogen is unchanged throughout the inventive process, the term "porogen" as used herein is intended to encompass pore-forming reagents and derivatives thereof, in whatever forms they are found throughout the entire process of the invention.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In addition, the reagents can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

In certain embodiments, mixtures of different organosilanes and/or organosiloxanes are used in combination. It is also within the scope of the invention to use combinations of multiple different porogens and organosilanes. Such embodiments facilitate adjusting the ratio of pores to Si in the final product, and/or enhance one or more critical properties of the base OSG structure. For example, a deposition utilizing diethoxymethylsilane (DEMS) and porogen might use an additional organosilicon such as tetraethoxysilane (TEOS) to improve the film mechanical strength.

In addition to the structure forming species and the pore-forming species, additional materials can be charged into the vacuum chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide a more stable final film) and reactive substances, such as gaseous or liquid organic substances, $NH_3$, $H_2$, $CO_2$, or CO. $CO_2$ is the preferred carrier gas. Oxidizing gases such as, for example, $O_2$, $N_2O$, $NO$, $NO_2$ and $O_3$ may also be added.

Energy is applied to the gaseous reagents to induce the gases to react and to form the film on the substrate. Such energy can be provided by, e.g., thermal, plasma, pulsed plasma, helicon plasma, high density plasma, inductively coupled plasma, and remote plasma methods. A secondary radio frequency (rf) frequency source can be used to modify the plasma characteristics at the substrate surface. Preferably, the film is formed by plasma enhanced chemical vapor deposition. It is particularly preferred to generate a capacitively coupled plasma at a frequency of 13.56 MHz. Plasma power is preferably from 0.02 to 7 watts/cm$^2$, more preferably 0.3 to 3 watts/cm$^2$, based upon a surface area of the substrate. It may be advantageous to employ a carrier gas which possesses a low ionization energy to lower the electron temperature in the plasma which in turn will cause less fragmentation in the OSG precursor and porogen. Examples of this type of low ionization gas include $CO_2$, $NH_3$, $CO$, $CH_4$, Ar, Xe, and Kr.

The flow rate for each of the gaseous reagents preferably ranges from 10 to 5000 sccm, more preferably from 30 to 1000 sccm, per single 200 mm wafer. The individual rates are selected so as to provide the desired amounts of structure-former and pore-former in the film. The actual flow rates needed may depend upon wafer size and chamber configuration, and are in no way limited to 200 mm wafers or single wafer chambers.

It is preferred to deposit the film at a deposition rate of at least 50 nm/min.

The pressure in the vacuum chamber during deposition is preferably 0.01 to 600 torr, more preferably 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

The porosity of the film can be increased with the bulk density being correspondingly decreased to cause further reduction in the dielectric constant of the material and extending the applicability of this material to future generations (e.g., k<2.0).

The following are non-limiting examples of Si-based precursors suitable for use with a distinct porogen according to the present invention. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R^1_n(OR^2)_{4-n}Si$, when n is 2 or 3, the two or three $R^1$ groups need not be identical to each other or to $R^2$.

$R^1_n(OR^2)_{3-n}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated, n is 1 to 3.

Example: diethoxymethylsilane, dimethyldimethoxysilane $R^1_n(OR^2)_{3-n}Si$—O—$SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diethoxydisiloxane $R^1_n(OR^2)_{3-n}Si$—$SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated, $R^2$ and $R^4$ can be independently $C_1$ to $C_6$, linear or branched, saturated, singly or multiply unsaturated, cyclic, partially or fully fluorinated, n is 1 to 3 and m is 1 to 3.

Example: 1,2-dimethyl-1,1,2,2-tetraethoxydisilane $R^1_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, n is 1 to 3.

Example: dimethyldiacetoxysilane $R^1_n(O(O)CR^2)_{3-n}Si$—O—$SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diacetoxydisiloxane $R^1_n(O(O)CR^2)_{3-n}Si$—$SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraacetoxydisilane $R^1_n(O(O)CR^2)_{3-n}Si$—O—$SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1-acetoxy-3-ethoxydisiloxane $R^1_n(O(O)CR^2)_{3-n}Si$—$SiR^3_m(OR^4)_{3-m}$ where $R^1$ and R ican be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1-acetoxy-2-ethoxydisilane $R^1{}_n(OR^2)_p(O(O)CR^4)_{4-(n+p)}Si$ where $R^1$ can be independently H, $C_1$ to $C_4$, linear or branched, saturated, singly or multiply unsaturated, cyclic, partially or fully fluorinated, $R^2$ can be independently $C_1$ to $C_6$, linear or branched, saturated, singly or multiply unsaturated, cyclic, aromatic, partially or fully fluorinated and $R^4$ can be independently H, $C_1$ to $C_6$, linear or branched, saturated, singly or multiply unsaturated, cyclic, aromatic, partially or fully fluorinated, and n is 1 to 3 and p is 1 to 3.

Example: methylacetoxy-t-butoxysilane $R^1{}_n(OR^2)_p(O(O)CR^4)_{3-n-p}Si—O—SiR^3{}_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$ and $R^6$ can be independently $C_1$ to $C_6$, linear or branched, saturated, singly or multiply unsaturated, cyclic, aromatic, partially or fully fluorinated, $R^4$ and $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,3-dimethyl-1,3-diacetoxy-1,3-diethoxydisiloxane $R^1{}_n(OR^2)_p(O(O)CR^4)_{3-n-p}Si—SiR^3{}_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$, $R^6$ can be independently $C_1$ to $C_6$, linear or branched, saturated, singly or multiply unsaturated, cyclic, aromatic, partially or fully fluorinated, $R^4$, $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,2-dimethyl-1,2-diacetoxy-1,2-diethoxydisilane cyclic siloxanes of the formula $(OSiR_1R_3)_x$, where $R^1$ and Rican be independently H, $C_1$ to $C_4$, linear or branched, saturated, singly or multiply unsaturated, cyclic, partially or fully fluorinated, and x may be any integer from 2 to 8.

Examples: 1,3,5,7-tetramethylcyclotetrasiloxane, octamethylcyclotetrasiloxane

Provisos to all above precursor groups: 1) a porogen is added to the reaction mixture, and 2) a curing (e.g., anneal) step is used to remove substantially all of the included porogen from the deposited film to produce a k<2.6.

The above precursors may be mixed with porogen or have attached porogens, and may be mixed with other molecules of these classes and/or with molecules of the same classes except where n and/or m are from 0 to 3.

Examples: TEOS, triethoxysilane, di-tertiarybutoxysilane, silane, disilane, di-tertiarybutoxydiacetoxysilane, etc.

The following are additional formulas representing certain Si-based precursors suitable for use with a distinct porogen according to the present invention:

(a) the formula $R^1{}_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3;

(b) the formula $R^1{}_n(OR^2)_p(O(O)CR^4)_{3-n-p}Si—O—SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(c) the formula $R^1{}_n(OR^2)_p(O(O)CR^4)_{3-n-p}Si—SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(d) the formula $R^1{}_n(OR^2)_p(O(O)CR^4)_{3-n-p}Si—R^7—SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3, and m+q≤3;

(e) the formula $(R^1{}_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, provided that n+p≤4;

(f) the formula $(R^1{}_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, provided that n+p≤4;

(g) cyclic siloxanes of the formula $(OSiRiR_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8;

(h) cyclic silazanes of the formula $(NR_1SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8; and (i) cyclic carbosilanes of the formula $(CR_1R_3SiRiR_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8.

Although reference is made throughout the specification to siloxanes and disiloxanes as precursors and porogenated precursors, it should be understood that the invention is not limited thereto, and that other siloxanes, such as trisiloxanes and other linear siloxanes of even greater length, are also within the scope of the invention.

The above precursors may be mixed with other molecules of these same classes and/or with molecules of the same classes except where n and/or m are from 0 to 3.

The following are non-limiting examples of materials suitable for use as porogens according to the present invention:

(b) A porogen precursor comprising a compound represented by the following formula:

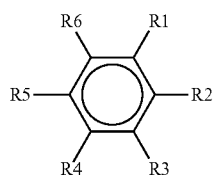

where R1-R6 are independently selected from the group consisting of: H; OH; $C_1$ to $C_6$ linear, branched, cyclic, saturated, singly or multiply unsaturated, hydrocarbon; and $C_1$ to $C_6$ linear, branched, cyclic, saturated or multiple unsaturated, ether, epoxide, alcohol, and ketone. Examples include: toluene, benzene, cymene, xylene, phenol, mesitylene, ethyl benzene, styrene, ethoxybenzene, methoxybenzene, benzaldehyde and mixtures thereof.

The invention further provides compositions to be employed according to the claimed methods of the present invention. A composition according to the present invention preferably comprises:

(A) (1) at least one precursor selected from the group consisting of:

(a) the formula $R^1{}_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3;

(b) the formula $R^1{}_n(OR^2)_p(O(O)CR^4)_{3-n-p}Si-O-SiR^3{}_m(O(O)CR^5)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(c) the formula $R^1{}_n(OR^2)_p(O(O)CR^4)_{3-n-p}Si-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(d) the formula $R^1{}_n(OR^2)_p(O(O)CR^4)_{3-n-p}Si-R^7-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3, and m+q≤3;

(e) the formula $(R^1{}_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, provided that n+p≤4;

(f) the formula $(R^1{}_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, provided that n+p≤4;

(g) cyclic siloxanes of the formula $(OSiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8;

(h) cyclic silazanes of the formula $(NR_1SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8; and (i) cyclic carbosilanes of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8, and wherein the porogen precursor is aromatic in nature, and represented by the formula:

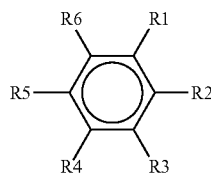

where R1-R6 are independently selected from the group consisting of: H; OH; $C_1$ to $C_6$ linear, branched, cyclic, saturated, singly or multiply unsaturated, hydrocarbon; and $C_1$ to $C_6$ linear, branched, cyclic, saturated or multiple unsaturated, ether, epoxide, alcohol, and ketone;

In certain embodiments of the composition comprising a precursor, the composition preferably comprises: (a) (i) at least one precursor selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dim ethyldimethoxysilane, dimethyldiethoxysilane, dimethyldi-isopropoxysilane, dimethyldi-t-butoxysilane, 1,3,5,7-tetramethylcyclotatrasiloxane, octamethyl-cyclotetrasiloxane and tetraethoxysilane, and (ii) a porogen distinct from the at least one precursor, said porogen being a member selected from the group consisting of toluene, benzene, cymene, xylene, phenol, mesitylene, ethyl benzene, styrene, ethoxybenzene, methoxybenzene, benzaldehyde and mixtures thereof.

In certain embodiments the composition preferably comprises: a composition comprising: (a) (i) at least one precursor selected from the group consisting of diethoxymethylsilane, dim ethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, and tetraethoxysilane, trimethylsilane, tetramethylsilane, diethoxymethylsilane, dimethoxymethylsilane, ditertiarybutoxymethylsilane, methyltriethoxysilane, dimethyldimethoxysilane, dimethyldiethoxysilane, methyltriacetoxysilane, methyldiacetoxysilane, methylethoxydisiloxane, tetramethylcyclotetrasiloxane, octamethylcyclotetrasiloxane, dim ethyldiacetoxysilane, bis(trimethoxysilyl)methane, bis (dimethoxysilyl)methane, tetraethoxysilane, triethoxysilane, 1,1,33-tetramethyl-1,3-disilacyclobutane; 1,1,3,3-tetraethoxy-1,3-disilacyclobutane, 1,3-dimethyl-1,3-diethoxy-1,3-disilacyclobutane, 1,3-diacetoxy-1,3-methyl-1,3-disilacyclobutane, 1,1,3,3-tetraacetoxy-1,3-disilacyclobutane, 1,3-disilabutane; 1,1,1,3,3,3-hexamethoxy-1,3-disilapropane, 1,1,1,3,3,3-hexaethoxy-1,3-disilapropane, 1,3-disilapropane; 1,1,1-tetramethoxy-1,3-disilapropane, 1,1,1,3,3,3-hexaacetoxy-1,3-disilapropane, 1,1,1-tetraethoxy-1,3-disilapropane; 1,3-disilacyclobutane, 1,3-diethoxy-1,3-disilabutane; 1,3-diethoxy-1-methyl-1,3-disilabutane, 1,1,3,3-tetraethoxy-1-methyl-1,3-disilabutane, 1,1,3,3-tetramethoxy-1-methyl-1,3-disilabutane, 1,1,3,3-tetraacetoxy-1-methyl-1,3-dilabutane and mixtures thereof; and (ii) a porogen distinct from the at least one precursor, said porogen being a member selected from the group consisting of toluene, benzene, cymene, xylene, phenol, mesitylene, ethyl benzene, styrene, ethoxybenzene, methoxybenzene, benzaldehyde and mixtures thereof.

Compositions of the invention can further comprise, e.g., at least one pressurizable vessel (preferably of stainless steel) fitted with the proper valves and fittings to allow the delivery of porogen, non-porogenated precursor and/or porogenated precursor to the process reactor. The contents of the vessel(s) can be premixed. Alternatively, porogen and precursor can be maintained in separate vessels or in a single vessel having separation means for maintaining the porogen and precursor separate during storage. Such vessels can also have means for mixing the porogen and precursor when desired.

The porogen is fully or partially removed from the preliminary (or as-deposited) film by a curing step, which can comprise thermal annealing, exposure to ultraviolet radiation, chemical treatment, in-situ or remote plasma treating, photocuring and/or microwaving. Other in-situ or post-deposition treatments may be used to enhance materials properties like hardness, stability (to shrinkage, to air exposure, to etching, to wet etching, etc.), integrity, uniformity and adhesion. Such treatments can be applied to the film prior to, during and/or after porogen removal using the same or different means used for porogen removal. Thus, the term "post-treating" as used herein denotes treating the film with energy (e.g., thermal, plasma, photon, electron, microwave, etc.) or chemicals to remove porogens and, optionally, to enhance materials properties.

The conditions under which post-treating are conducted can vary greatly. For example, post-treating can be conducted under high pressure or under a vacuum ambient.

Annealing is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal annealing as well as any other post-treating means. The temperature is preferably 200-500° C., and the temperature ramp rate is from 0.1 to 100 deg ° C./min. The total annealing time is preferably from 0.01 min to 12 hours.

Chemical treatment of the OSG film is conducted under the following conditions.

The use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

Supercritical fluid post-treatment for selective removal of porogens from an organosilicate film is conducted under the following conditions.

The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

Plasma treating for selective removal of labile groups and possible chemical modification of the OSG film is conducted under the following conditions.

The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-5000 W. The temperature is preferably ambient to 500° C. The pressure is preferably 10 mtorr to atmospheric pressure. The total curing time is preferably 0.01 min to 12 hours.

Photocuring or UV exposure is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths<200 nm). The total curing time is preferably 0.01 min to 12 hours.

Microwave post-treatment for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment for selective removal of porogens or specific chemical species from an organosilicate film and/or improvement of film properties is conducted under the following conditions.

The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties through bond-formation processes in matrix.

The invention will be illustrated in more detail with reference to the following Examples, but it should be understood that the present invention is not deemed to be limited thereto.

EXAMPLES

All experiments were performed on an Applied Materials Precision-5000 system in a 200 mm DxZ chamber fitted with an Advance Energy 2000 rf generator, using an undoped TEOS process kit. The recipe involved the following basic steps: initial set-up and stabilization of gas flows, deposition, and purge/evacuation of chamber prior to wafer removal. Films were annealed in a tube furnace at 425° C. for 4 hours under $N_2$.

Thickness and refractive index were measured on an SCI Filmtek 2000 Reflectometer. Dielectric constants were determined using Hg probe technique on low resistivity p-type wafers (<0.02 ohm-cm). Mechanical properties were determined using MTS Nano Indenter. Thermal stability and off-gas products were determined by thermogravimetric analysis on a Thermo TA Instruments 2050 TGA. Compositional data were obtained by x-ray photoelectron spectroscopy (XPS) on a Physical Electronics 5000LS. The atomic % values reported in the tables do not include hydrogen.

Three routes were chosen for introducing porosity into an OSG film. The first route investigated to produce low k films with k<2.6 co-deposited a thermally labile organic oligomer as the porogen along with the OSG by plasma enhanced chemical vapor deposition (PECVD) and then removed the oligomer post-deposition in a thermal annealing step.

Example 1A

Figure 4:
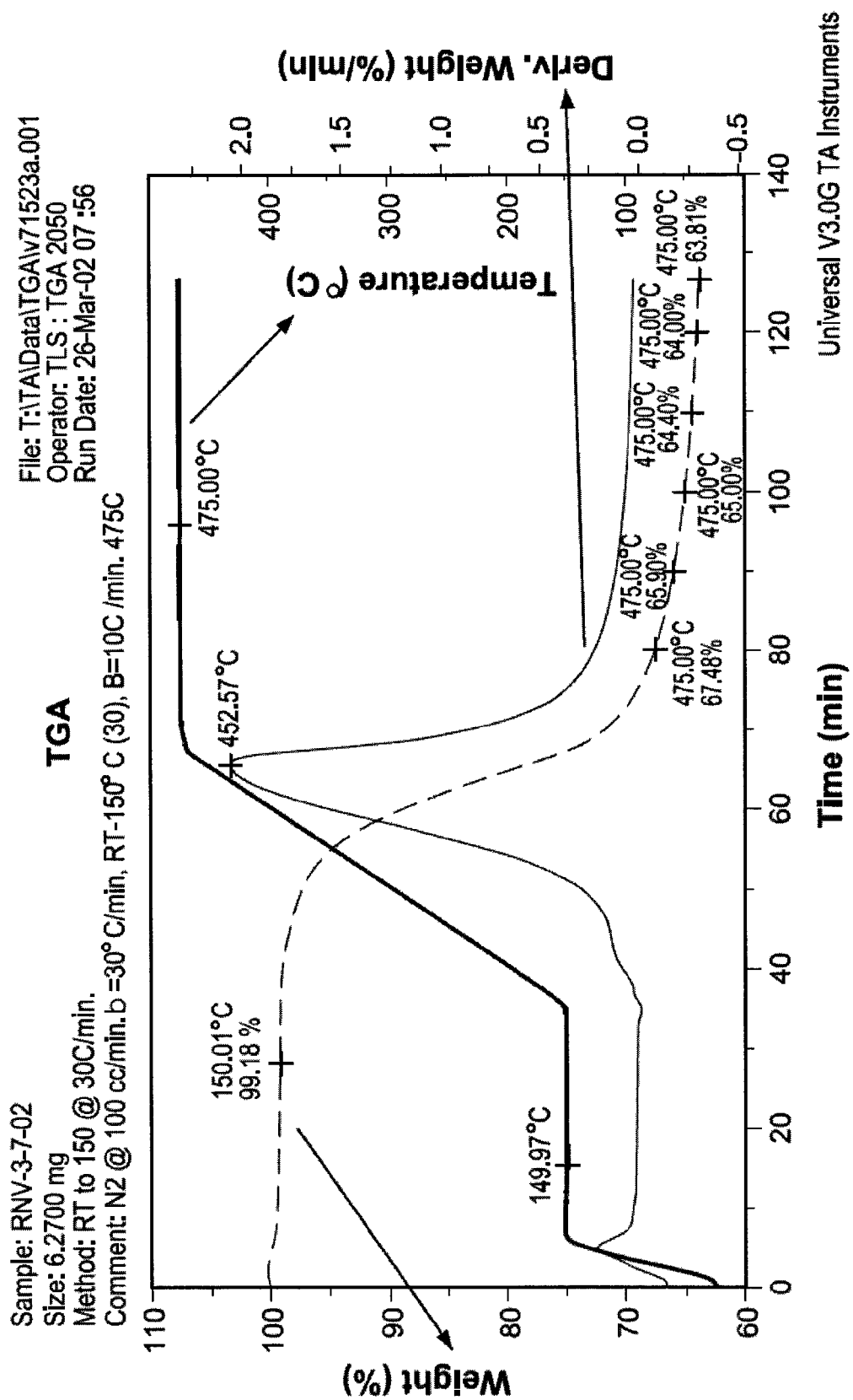
FIG. 4 is a thermogravimetric analysis of the film of the present invention during anneal indicating weight loss resulting from the loss of thermally labile group from the film.

Alpha-terpinene (ATRP) was co-deposited with diethoxymethylsilane (DEMS) onto a silicon wafer via PECVD in an oxidant-free environment. The process conditions were 700 milligrams per minute (mgm) flow of a 39.4% (by volume) mixture of ATRP in DEMS. A carrier gas flow of 500 sccm of $CO_2$ was used to escort the chemicals into the deposition chamber. Further process conditions were as follows: a chamber pressure of 5 Torr, wafer chuck temperature of 150° C., showerhead to wafers spacing of 0.26 inches, and plasma power of 300 watts for a period of 180 seconds. The film as deposited had a thickness of 650 nm and a dielectric constant of 2.8. The film was annealed at 425° C. under nitrogen for 4 hours to remove substantially all of the incorporated ATRP, as evidenced by XPS. FIG. 1 shows infrared spectra of the film before (dotted line) and after (solid line) annealing, indicating the elimination of the porogen. The annealed film had a thickness of 492 nm and a dielectric constant of 2.4 (see Table 2 below). FIG. 4 shows a thermogravimetric analysis of the film to demonstrate weight loss occurring during thermal treatments.

Example 1B

ATP was co-deposited with DEMS onto a silicon wafer via PECVD in an oxidant-free environment. The process conditions were 1300 milligrams per minute (mgm) flow of a 70% (by volume) mixture of alpha-terpinene in DEMS. A carrier gas flow of 500 sccm of $CO_2$ was used to entrain the chemicals into the gas flow into the deposition chamber. Further process conditions were as follows: a chamber pressure of 8 Torr, wafer chuck temperature of 200° C., showerhead to wafers spacing of 0.30 inches, and plasma power of 600 watts for a period of 120 seconds. The film as deposited had a thickness of 414 nm and a dielectric constant of 2.59. The film was annealed at 425° C. under nitrogen for 4 hours to remove substantially all the incorporated ATRP. The annealed film had a thickness of 349 nm and a dielectric constant of 2.14 (see Table 2 below).

Example 1C

Figure 2:
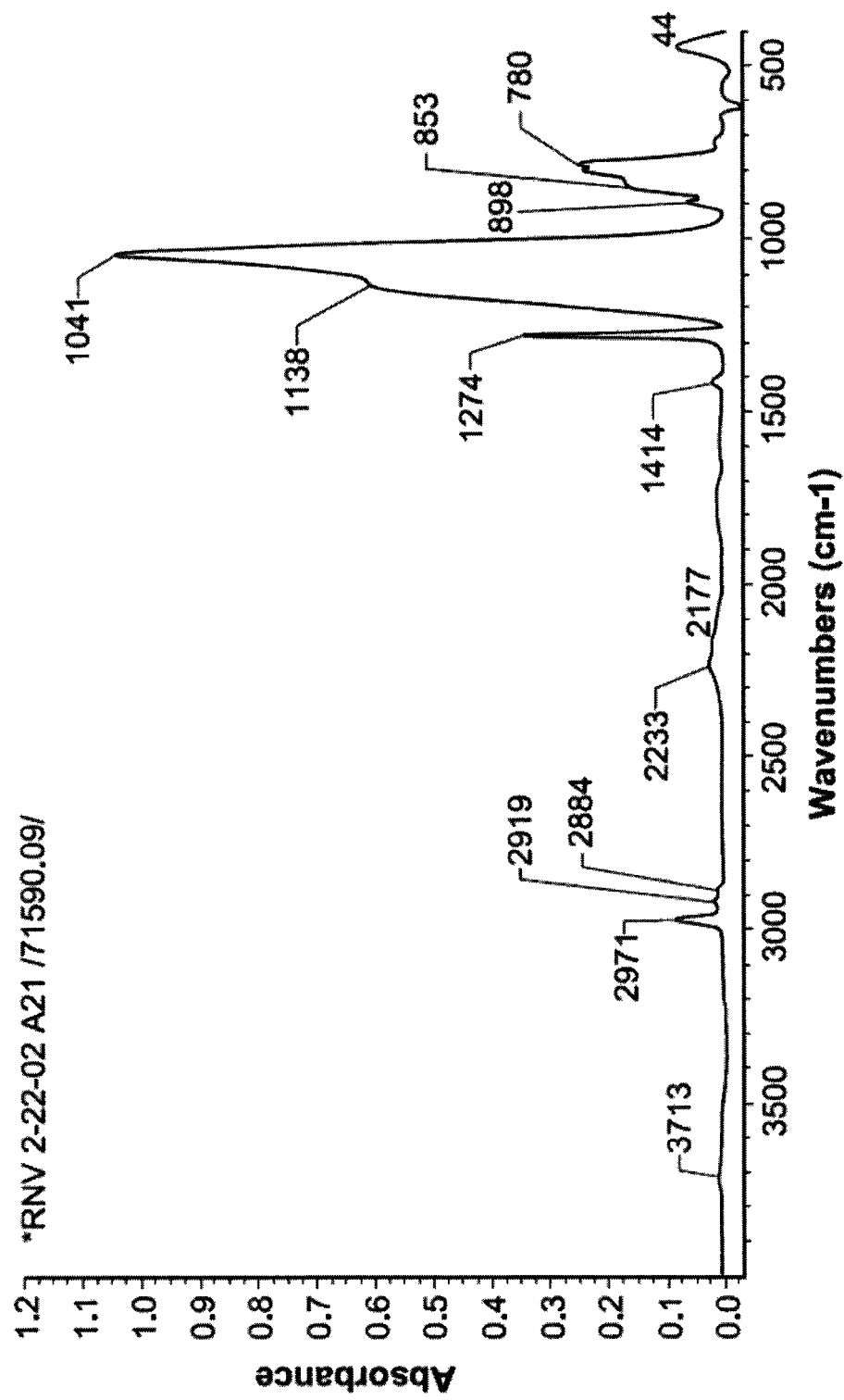
FIG. 2 is an infrared spectrum of the film of the present invention identifying the peaks of the components of the film.
Figure 3:
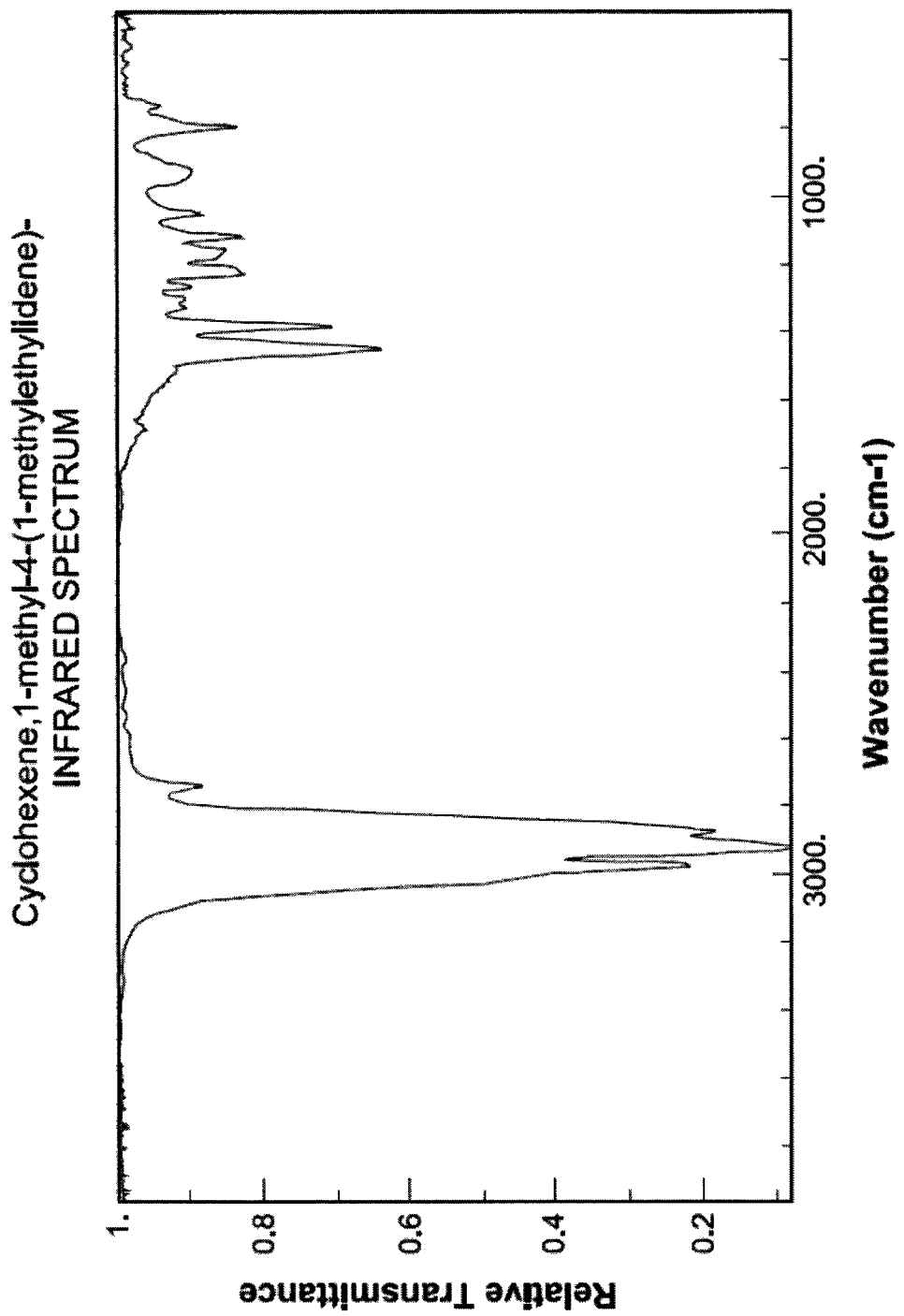
FIG. 3 is an infrared spectrum of alpha-terpinene (ATRP), a thermally labile group useful as a pore forming additive in the present invention.

A film was prepared and annealed substantially in accordance with Example 1A except that the anneal was conducted at a reduced temperature of 400° C. The infrared spectrum of the resulting film, including wavenumbers, is shown in FIG. 2. The infrared spectrum of the porogen, ATRP, is shown in FIG. 3 for comparison.

Example 1D (Comparative)

A film was prepared and annealed substantially in accordance with Example 1A except that no porogens were used. The film had a dielectric constant of 2.8, and a composition substantially identical to the annealed film of Example 1A (see Tables 1 and 2).

Example 1E (Comparative)

A film was prepared and annealed substantially in accordance with Example 1D except that the plasma power was 400 watts. The film had a dielectric constant of 2.8, and a composition substantially identical to the annealed film of Example 1A (see Tables 1 and 2).

Example 1F

A film was prepared and annealed substantially in accordance with Example 1A except that the process conditions were 1000 milligrams per minute (mgm) flow of a 75% (by volume) mixture of alpha-terpinene (ATRP) in di-t-butoxymethylsilane (DtBOMS). A carrier gas flow of 500 sccm of $CO_2$ was used to escort the chemicals into the deposition chamber. Further process conditions were as follows: a chamber pressure of 7 Torr, wafer chuck temperature of 215° C., showerhead to wafers spacing of 0.30 inches, and plasma power of 400 watts for a period of 240 seconds. The film as deposited had a thickness of 540 nm and a dielectric constant of 2.8. The film was annealed at 425° C. under nitrogen for 4 hours to remove substantially all the incorporated alpha-terpinene. The annealed film had a thickness of 474 nanometer (nm) and a dielectric constant of 2.10. The modulus and hardness were 2.23 and 0.18 GPa, respectively.

Example 1G

ATRP was co-deposited with DtBOMS onto a silicon wafer via PECVD in an oxidant-free environment. The process conditions were 700 milligrams per minute (mgm) flow of a 75% (by volume) mixture of ATRP in DtBOMS. A carrier gas flow of 500 sccm of $CO_2$ was used to escort the chemicals into the deposition chamber. Further process conditions were as follows: a chamber pressure of 9 Torr, wafer chuck temperature of 275° C., showerhead to wafers spacing of 0.30 inches, and plasma power of 600 watts for a period of 240 seconds. The film as deposited had a thickness of 670 nm and a dielectric constant of 2.64. The film was annealed at 425° C. under nitrogen for 4 hours to remove substantially all the incorporated ATRP. The annealed film had a thickness of 633 nm and a dielectric constant of 2.19. The modulus and hardness were 3.40 and 0.44 GPa, respectively.

Example 2

A third route investigated to produce low k films with k<2.6 was to physically mix an organosilicon precursor with a silica precursor having a large thermally labile group attached to it. To prove the efficacy of this route, fufuroxydimethylsilane was co-deposited with tetramethylcyclotetrasiloxane (TMCTS) at the following conditions; 1000 milligrams/meter (mgm) flow of an 11% mixture of furfuroxydimethylsilane in TMCTS and a carrier gas flow of 500 sccm of He, a chamber pressure of 6 Torr, wafer chuck temperature of 150° C., showerhead to wafers spacing of 0.26 inches, and plasma power of 300 watts for a period of 40 seconds. Thickness of the as-deposited film was 1220 nm with a dielectric constant of 3.0. The inclusion of the furfuroxy was indicated by FTIR in the as-deposited films. After thermal post-treatments at 400° C. in nitrogen for 1 hour the k was reduced to 2.73. It is likely in this case that there was remaining a significant portion of the incorporated furfuroxy groups even after thermal anneal.

The preceding examples indicate the ability to incorporate a variety of functional groups into as-deposited films, and more critically the importance of the proper choice of the porogen to enable materials with k<2.6. A variety of other porogens can also function using these routes. To provide optimum low dielectric constant materials with k<2.6 requires good network-forming organosilane/organosiloxane precursors which can provide the proper type and amount of organic-group incorporation in the OSG network. It is preferred that network-forming precursors which do not require the addition of oxidant to produce OSG films be used. This is of particular importance when using hydrocarbon-based pore-forming precursors which are susceptible to oxidation. Oxidation may cause significant modification of the pore-former during deposition which could hamper its ability to be subsequently removed during annealing processes.

TABLE 1

XPS Data

| Example | Description | C | O | N | Si | Conditions |
| --- | --- | --- | --- | --- | --- | --- |
| 1A | DEMS-ATRP | 51.8 | 25.6 | ND | 22.6 | 150° C., 300 W |
| 1A | Annealed | 24.5 | 43.1 | ND | 32.4 | 425° C., 4 hrs. |
| 1E | DEMS | 28.8 | 38.8 | ND | 32.4 | 150° C., 400 W |
| 1E | Annealed | 25.1 | 41.4 | ND | 33.5 | 425° C., 4 hrs. |
| 1D | DEMS | 27.0 | 40.6 | ND | 32.4 | 150° C., 300 W |
| 1D | Annealed | 23.4 | 42.7 | ND | 33.9 | 425° C., 4 hrs. | all compositional analysis after 30 sec Ar sputter to clean surface; inherent measurement error +/−2 atomic %.
Note:
Hydrogen cannot be determined by XPS; atomic compositions shown are normalized without hydrogen

TABLE 2

Film Property Data

| Example | Description | K | Refractive Index | Δ Thickness (%) | H (GPa) | M (GPa) |
| --- | --- | --- | --- | --- | --- | --- |
| 1D; 1E | Various DEMS (as-deposited) | 2.9-3.1 | 1.435 | — | 0.30-0.47 | 2.4-3.5 |
| 1D; 1E | Various DEMS (post-treated) | 2.80 | 1.405 | 7-10 | — | — |
| 1A | DEMS-ATRP (as-deposited) | 2.80 | 1.490 | — | — | — |
| 1A | DEMS-ATRP(post-treated) | 2.41 | 1.346 | 22 | 0.36 | 3.2 |
| 1B | DEMS-ATRP (as-deposited) | 2.59 | | | | |

TABLE 2-continued

Film Property Data

| Example | Description | K | Refractive Index | Δ Thickness (%) | H (GPa) | M (GPa) |
|---|---|---|---|---|---|---|
| 1B | DEMS-ATRP (post-treated) | 2.14 | | 16 | | |
| 1F | DtBOMS-ATRP (as-deposited) | 2.80 | 1.491 | — | — | — |
| 1F | DtBOMS-ATRP (post-treated) | 2.10 | 1.315 | 12 | 0.18 | 2.2 |
| 1G | DtBOMS-ATRP (as-deposited) | 2.64 | 1.473 | — | — | — |
| 1G | DtBOMS-ATRP (post-treated) | 2.19 | 1.334 | 5.5 | 0.44 | 3.4 |

Note:
all depositions performed at 150° C., hardness (H) and modulus (M) determined by nanoindentation.

Comparison of the IR spectrum of as-deposited and $N_2$ thermal post-treated DEMS/ATRP films shows that thermal post-treatment in an inert atmosphere is successful for selective removal of porogen and retention of the OSG lattice. There is essentially no change in the Si—$CH_3$ absorption at 1275 $cm^{-1}$ after thermal anneal (the Si—$CH_3$ is associated with the OSG network). However, there is seen a dramatic reduction in C—H absorptions near 3000 $cm^{-1}$ suggesting that essentially all the carbon associated with ATRP has been removed. The IR spectrum for ATRP is shown for reference in FIG. 3. An added benefit of this anneal appears to be a significant reduction in the Si—H absorption at 2240 and 2170 $cm^{-1}$ which should render the film more hydrophobic. Thus, in certain embodiments of the invention, each Si atom of the film is bonded to not more than one H atom. However, in other embodiments, the number of H atoms bonded to Si atoms is not so limited.

Compositional analysis indicates that the DEMS-ATRP film after anneal at 425° C. for 4 hrs (Example 1A) has essentially identical composition to a DEMS films deposited and annealed in the same manner (Example 1D). The DEMS-ATRP film prior to anneal indicates a substantially larger amount of carbon-based material in the film (IR analysis supports that this carbon-based material is very similar to ATRP—see FIG. 3). This supports the assertion that the porogen material incorporated into a DEMS film when co-deposited with ATRP is essentially completely removed by the thermal post-treatment process. Thermogravimetric analysis (FIG. 4) further indicates that significant weight loss of the as-deposited material is experienced when heated to temperatures above 350° C., which is additional proof of porogen removal during annealing. The observed film shrinkage is likely caused by collapse of some portion of the OSG network upon removal of the porogen. However, there is little loss of organic groups from the OSG network, i.e., terminal methyl groups within the DEMS are mostly retained (see the XPS data of pre and post thermal treatment for DEMS film shown in Table 1). This is supported by the relatively equivalent Si—$CH_3$ bands at ~1275 wavenumbers in the IR spectrum. Hydrophobicity of this material is substantiated by the lack of Si—OH groups in the IR spectrum. The decrease in refractive index and dielectric constants of the films post-annealing suggests that they are less dense than the pre-annealed film, despite the decrease in film thickness. Positron Annihilation Lifetime Spectroscopy (PALS) indicates pore sizes for samples 1A, 1B, and 1F in the range of ~1.5 nm equivalent spherical diameter. Also, unlike the work of Grill et al (referenced in the introduction), analysis of the thickness loss in conjunction with the compositional change (Example 1A) indicates that the OSG network is retained during anneal and not significantly degraded.

Example 3

All experiments were performed on an Applied Materials Precision-5000 system in a 200 mm DXZ chamber fitted with Advance Energy 2000 rf generator, using an undoped TEOS process kit. The recipe involved basic steps: initial step up and stabilization of gas flows, deposition, and purge/evacuation of chamber prior to wafer removal. Composite films were exposed to UV radiation using a Fusion H+ bulb under inert atmosphere with temperature controlled to 450 C or less. UV exposure times are optimized to balance dielectric constant and mechanical properties.

Example 3a

In Table 3, it is shown that for deposition processing conditions between 275-300° C., and standard UV cure times, films of dielectric constant k=2.3 can be achieved using the porogens alpha terpinene (ATRP), bicycloheptadiene (BCHD), para-cymene (PCM), or toluene in combination with the silicon-containing precursor, DEMS. When PCM or toluene are used, the carbon content by XPS is more than 50% increased compared to the DEMS-ATRP baseline. When an extended UV cure time is used, mechanical properties superior to the DEMS-ATRP baseline can be achieved with DEMS-PCM, while maintaining higher total carbon content.

Example 3b

In Table 4, it is shown that for deposition processing conditions between 300-315° C., films of dielectric constant k=2.5 can be achieved using the porogens alpha terpinene (ATRP), or para-cymene (PCM) in combination with the silicon-containing precursor, DEMS. When PCM is used, the carbon content is more than 50% increased compared to the DEMS-ATRP baseline. When an extended UV cure time is used, mechanical properties well above 5 GPa by nanoindentation can be achieved with DEMS-PCM while maintaining higher total carbon content.

Figure 5:
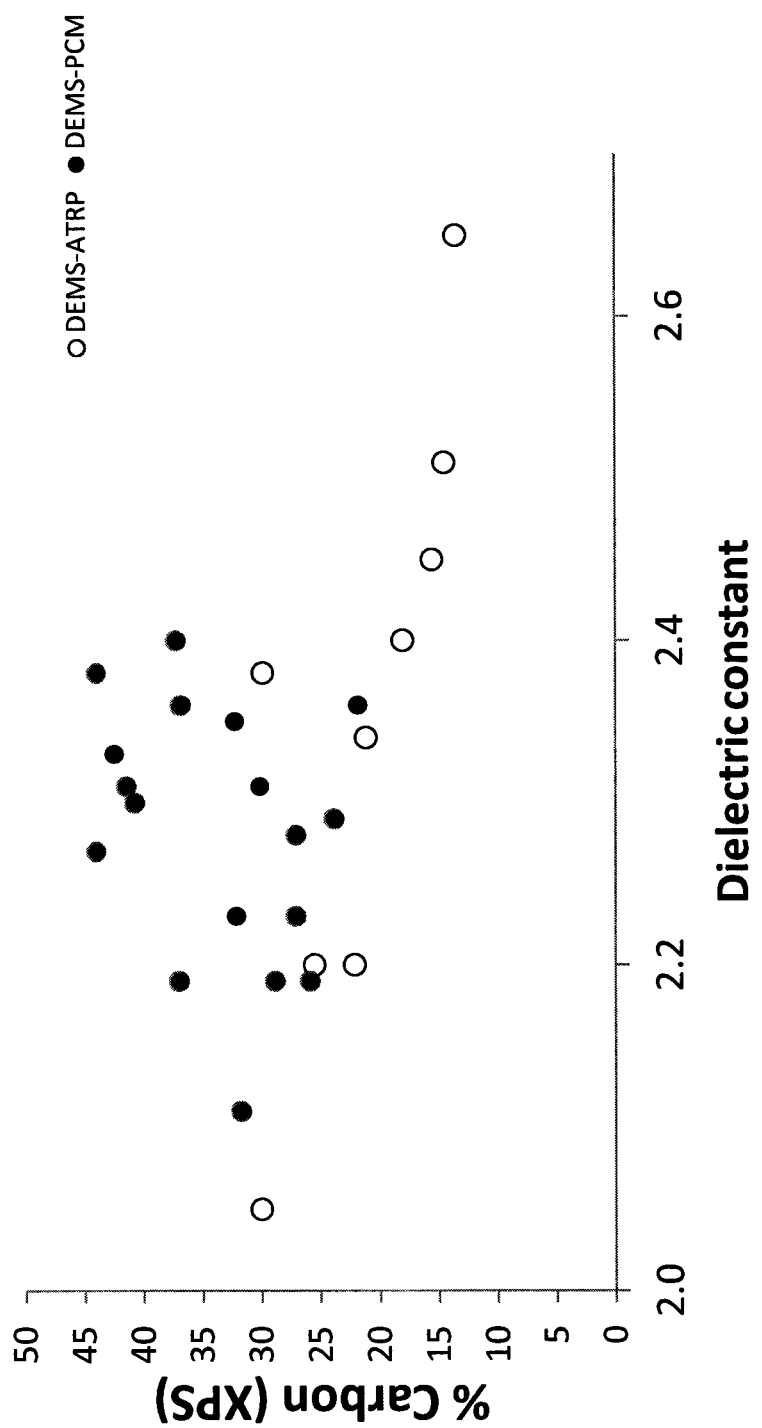
FIG. 5. X-ray photoelectron Spectroscopy (XPS) carbon content of porous dielectric films as a function of dielectric constant for a variety of plasma enhanced chemical vapor deposition (PECVD) deposition conditions. Diethoxymethylsilane-p-cymene (DEMS-PCM) films have the ability to introduce a broader range of total carbon content for a given dielectric constant compared to the industry standard Diethoxymethylsilane-alpha-terpinene (DEMS-ATRP).

FIG. 5 further demonstrates the carbon content range that is available when depositing films using DEMS and para-cymene. The process conditions used were 225-300° C., 500-800 Watts, 500-1100 mg/min total liquid flow, and 60-85% porogen precursor. For DEMS and ATRP, there is a fairly linear relationship between total carbon content and dielectric constant. However, for DEMS and para-cymene, the processing conditions that are used can greatly increase total carbon content, and thus, providing the option for greater integration damage optimization.

Example 3c

After deposition and UV exposure, films were exposed to an oxygen plasma to simulate integration damage.

Figure 6:
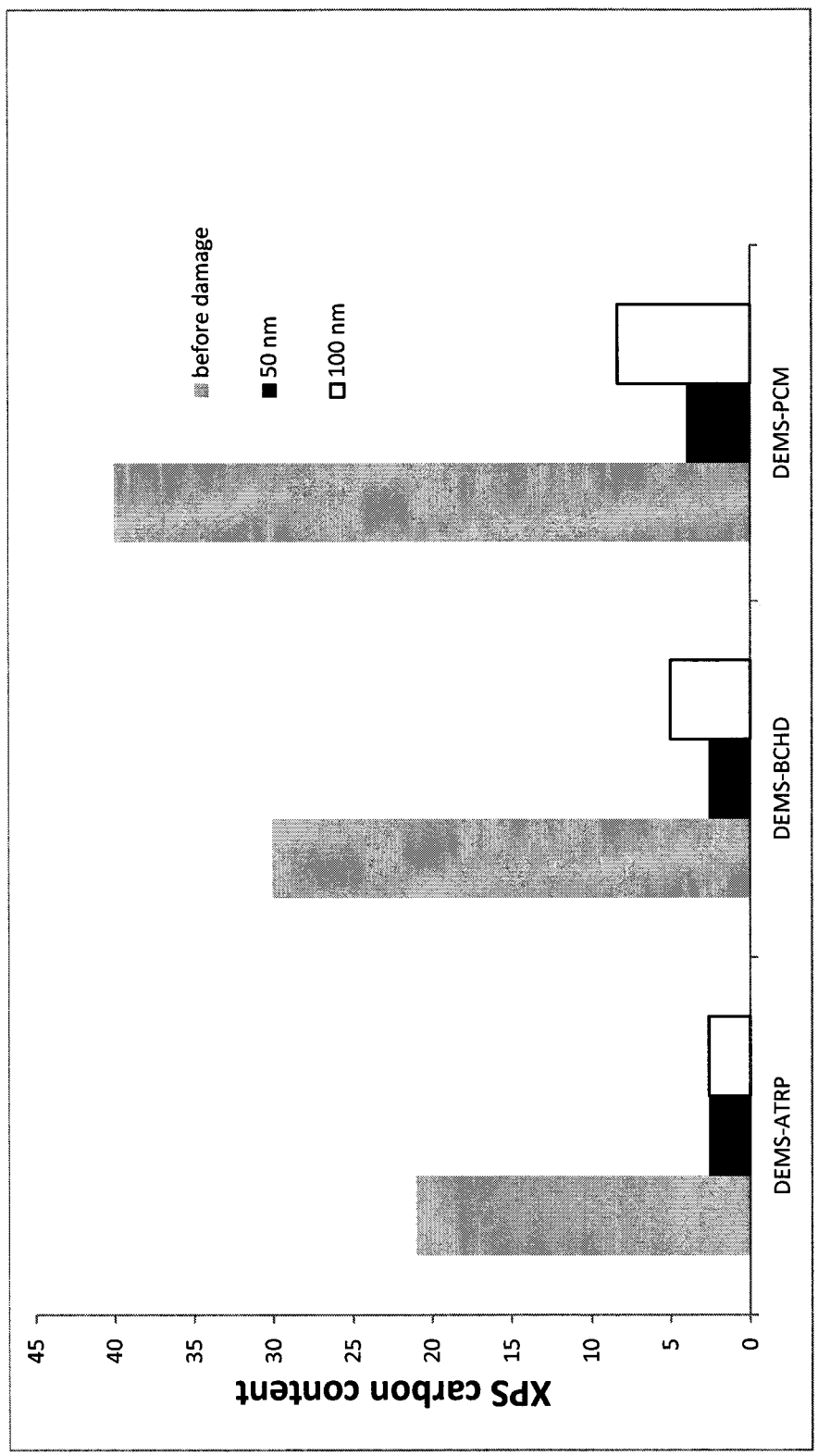
FIG. 6. XPS carbon content of k=2.3 porous films before plasma damage and after plasma damage. A highly aggressive remote oxygen exposure was utitilized to simulate oxidative ash damage. DEMS-PCM films result in higher remaining carbon content after damage, which is indicative of enhanced integration damage resistance FIG. 7. Modulus (FIG. 7A) and dielectric constant (FIG. 7B) of DEMS-PCM film as a function of ultraviolet (UV) cure time. Modulus can be greatly enhanced without substantial increase in dielectric constant. A high carbon content of 30% carbon by XPS is retained after 30 minutes of UV exposure FIG. 8. Hydrocarbon signal from Fourier Transform Infrared Spectroscopy (FT-IR) for DEMS-Paracymene films after various post-treatments using a deposition recipe targeting a final dielectric of k=2.2.

FIG. 6 demonstrates the film properties obtained using para-cymene as the porogen precursor. The deposition conditions were selected for this film in order to provide a high XPS carbon content before damage exposure. In this experiment, a remote oxygen plasma was used to damage the surface of a blanket dielectric film. It is expected that the remote oxygen plasma will be more aggressive that a typical etch process, and therefore the experiment represents a worst-case scenario. The carbon depletion was monitored using XPS after sputtering. It can be seen that a higher carbon content is retained for the para-cymene film compared to BCHD or ATRP. By using three XPS sputtering depths, it can be observed that the carbon loss for the DEMS-paracymene films at 100 nm is less than the comparative examples, resulting in a lower depth of damage.

Example 3d

After deposition, composite DEMS-paracymene films were treated with UV light for multiple exposure times.

Figures 7A, 7B:
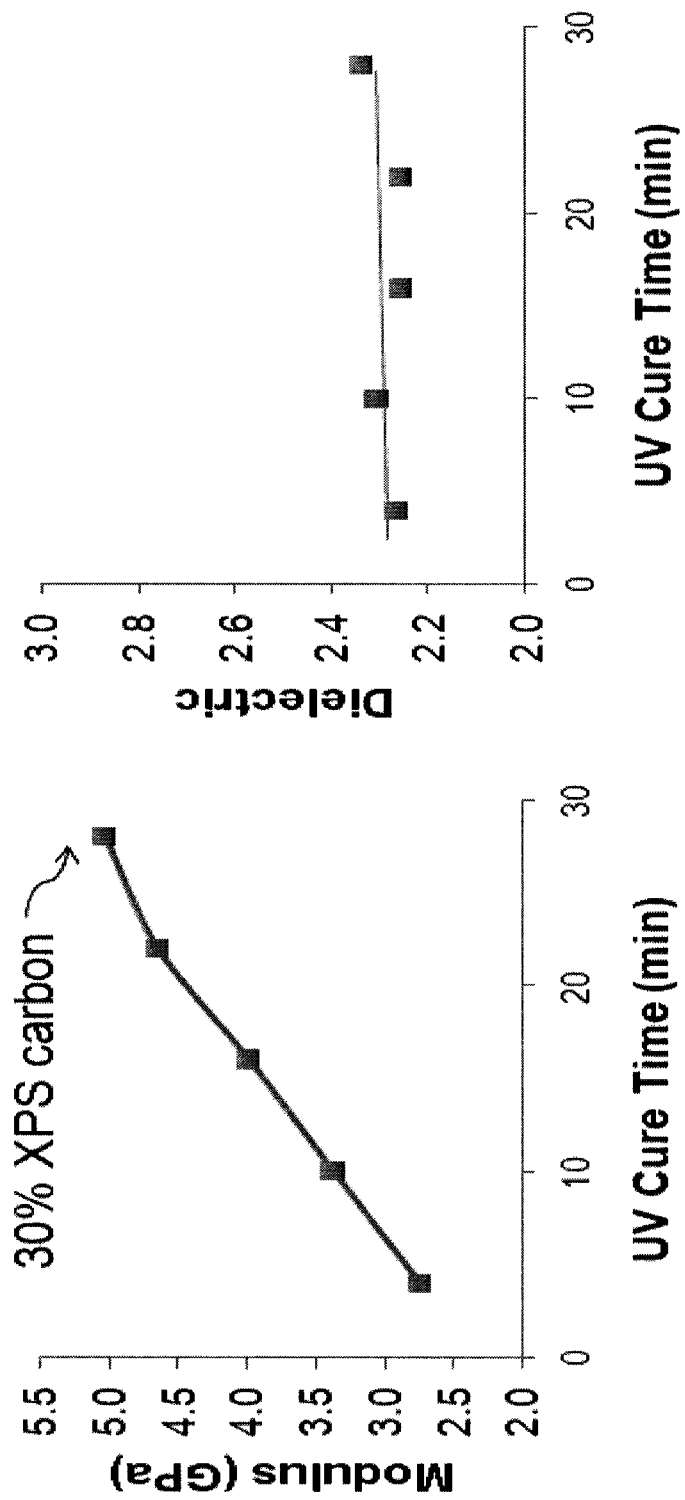

A high total carbon content and high modulus can be obtained by optimizing the UV cure time, that is utilized in post-treating the low k film. As illustrated in FIG. 7, modulus enhancement is observed by extending the total UV cure time, without significant impact to dielectric constant, and with retention of up to 30% carbon by XPS.

TABLE 3

|  | DEMS/ATRP | DEMS/BCHD | DEMS/PCM | DEMS/PCM | DEMS/TOLUENE |
|---|---|---|---|---|---|
| Power (Watts) | 600 | 500 | 650 | 650 | 650 |
| Temp (C.) | 300 | 275 | 275 | 275 | 300 |
| DEMS flow (mg/min) | 144 | 300 | 225 | 225 | 200 |
| Porogen flow (mg/min) | 620 | 300 | 675 | 675 | 800 |
| UV Cure Time | standard | standard | standard | 2.3 x standard | standard |
| Dielectric Constant | 2.3 | 2.3 | 2.3 | 2.3 | 2.3 |
| Modulus (Gpa) | 4.2 | 3.0 | 3.0 | 5.0 | 3.0 |
| XPS Carbon | 21% | 29% | 34% | 31% | 36% |
| XPS Oxygen | 46% | 41% | 34% | 38% | 33% |
| XPS Silicon | 33% | 30% | 32% | 31% | 31% |

TABLE 4

|  | DEMS/ATRP | DEMS/PCM | DEMS/PCM | DEMS/PCM |
|---|---|---|---|---|
| Power (Watts) | 750 | 650 | 650 | 650 |
| Temp (C.) | 300 | 315 | 315 | 315 |
| DEMS flow (mg/min) | 320 | 250 | 250 | 250 |
| Porogen flow (mg/min) | 745 | 750 | 750 | 750 |
| UV Cure Time | Standard 400 C. | Standard 400 C. | 2.5 x standard 400 C. | 1.8 X standard 420 C. |
| Dielectric Constant | 2.5 | 2.5 | 2.5 | 2.5 |
| Modulus (Gpa) | 7.9 | 4.1 | 6.0 | 11.0 |
| XPS Carbon | 19% | 33% | 29% | 23% |
| XPS Oxygen | 47% | 37% | 40% | 45% |
| XPS Silicon | 34% | 30% | 31% | 32% |

Example 3e

If an oxidizing gas is used, it may be preferable to limit the flow of the oxidizing species to <50% compared to the total liquid precursor vapor flow, or more preferably to less than 20% compared to the total liquid precursor vapor flow, by volume sccm. See Table 5. Preferred oxidants include: oxygen, hydrogen peroxide, ozone and dinitrogen oxide. Not wishing to be bound by theory, it is hypothesized that an oxidizing gas flow of >50% of the total liquid precursor vapor flow can result in inferior film mechanical properties.

TABLE 5

|  | DEMS flow (sccm) | Porogen flow (sccm) | Oxygen flow (sccm) |
|---|---|---|---|
| Example of preferred embodiment | 38 sccm (225 mg/min) | 110 sccm (675 mg/min) | 70 sccm |
| More preferred embodiment | 38 sccm (225 mg/min) | 110 sccm (225 mg/min) | 10 sccm |

Example 3f

Figure 8:
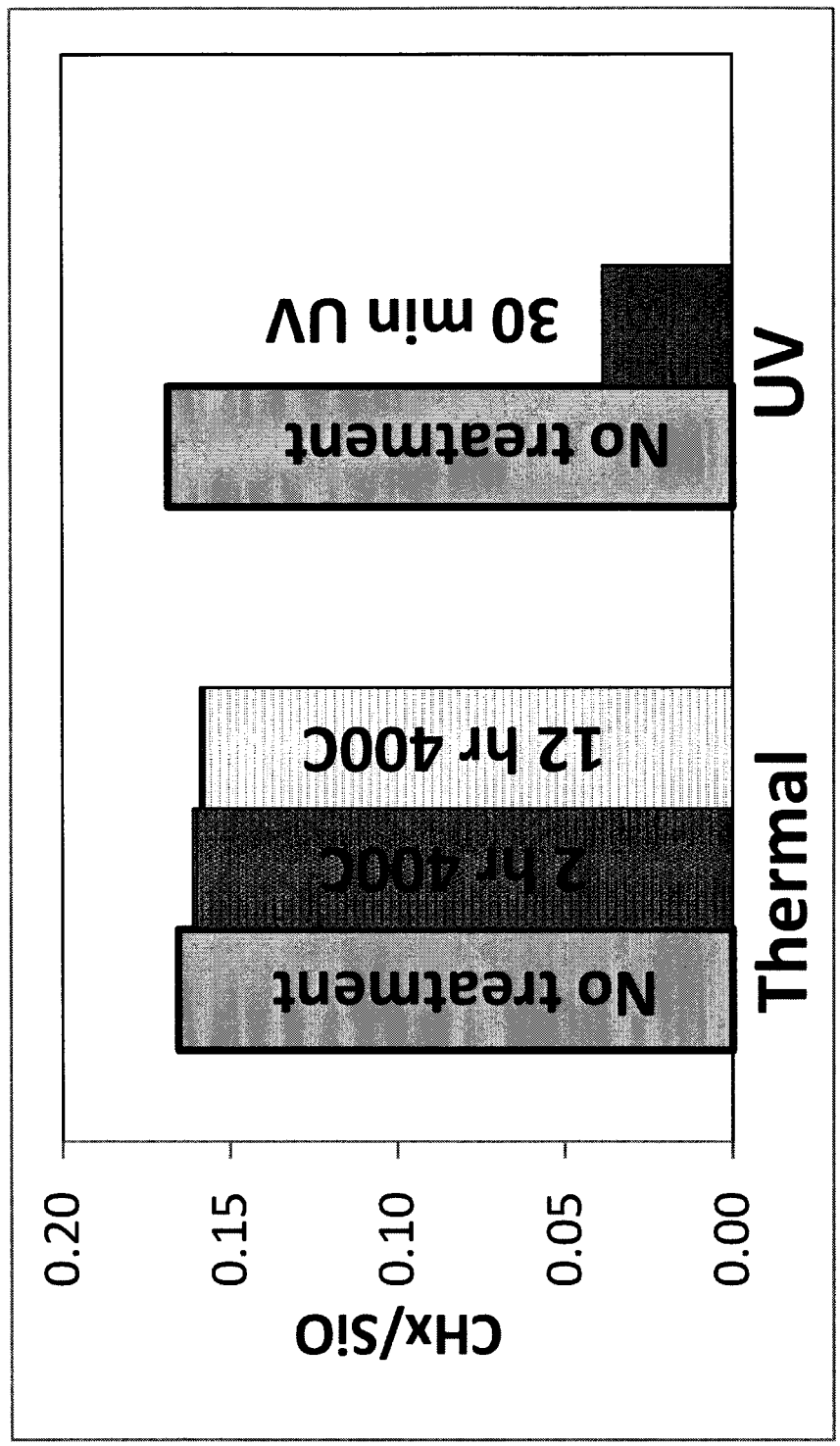

Composite films treated with a) UV and b) thermal exposures were compared. Here, we show the distinct benefit of using aromatic porogen precursors such as para-cymene in combination with UV post treatment. In FIG. 8, the $CH_x/SiO$ peak area ratio from FT-IR is plotted, while in FIG. 5 the FT-IR spectrum and peak assignments are shown. This $CH_x$ FT-IR signal at ~2800-3000 wavenumbers includes a majority contribution from the organic porogen present in the composite film before post treatment. As shown in the two figures, there is minimal CHx peak decrease and therefore porogen removal from DEMS-paracymene films when using thermal treatment at 400 C. under vacuum, even when extending the treatment to 12 hours. In contrast, 30 minutes of UV exposure removes a substantial amount of the porogen from the film. The benefit of the UV treatment is also observed in Table 5, where dielectric constants measured by mercury probe are listed. The ability of the UV treatment to remove porogen species from the composite film results in a dielectric constant of 2.27, compared to >2.8 for thermal treatment at 400 C. Similar trends are observed for recipe 2, which targets a k=2.5 film as the final result. In this case the UV post-treatment is also more effective in removing porogen from the composite film.

In addition, the use of UV curing provides mechanical property benefits when compared to thermal treatment, as shown in Table 6. The combination of an aromatic porogen, a organosilicon film backbone, and UV post treatment enables a low dielectric constant film with higher carbon content and sufficient mechanical properties compared to other precursor options.

Figure 9:
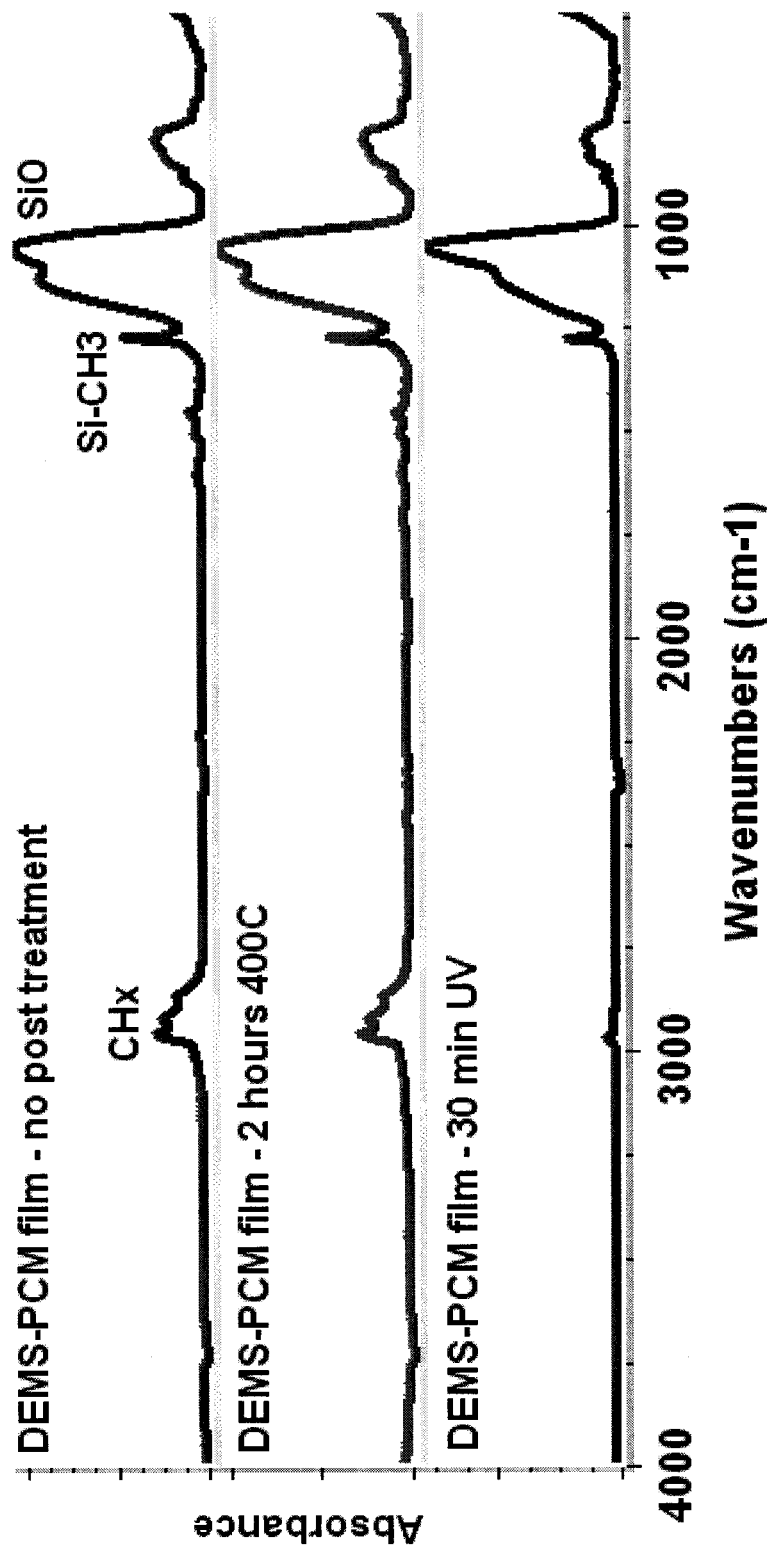
FIG. 9. FT-IR spectrum of DEMS-PCM film after UV exposure. Si—O, Si—$CH_3$, and $CH_x$ peaks are labeled.

The benefits of UV exposure to porous SiCOH films has been disclosed by APCI in U.S. Pat. No. 7,098,149 for precursors such as DEMS-ATRP. The UV process is proposed to strengthen the organosilicon backbone through at least two mechanisms. The first is conversion of cage like broad angle Si—O bonding to tetrahedral. This is observed as a decrease in FT-IR peak area around 1150 wavenumbers, as evidenced in FIG. 5. It can be observed in FIG. 9 that minimal change has occurred in the Si—O bonding region as a result of the thermal treatment, while substantial decrease in the ~1150 wavenumber peak is observed for UV post treatment. This is consistent with superior mechanical properties. A second potential mechanism is the loss of silicon-methyl backbone bonding with UV exposure. This is observed as a decrease in the FT-IR ~1280 peak as shown in FIG. 9. As terminal methyl bonds are lost, there is greater network connectivity achieved in the backbone, resulting in superior mechanical properties. The UV exposure is optimized so that the final silicon-methyl backbone content is such that the film remains hydrophobic with a water contact angle for example of 80-90 degrees.

Although mechanical properties can be improved by the removal of silicon-methyl backbone bonding, this traditionally also results in a lower total carbon content and therefore challenging integration. The reduction of film carbon content can then cause sidewall damage during patterning with standard techniques. Therefore, it is enabling to the industry to provide a porous film that has similar mechanical properties to industry baselines, but can provide higher total carbon content. The unique film composition provided by DEMS-paracymene deposition coupled with UV post treatment meets this need. The amorphous-type carbon provided during deposition is proposed to be unaffected by UV post treatment. Therefore significant carbon is retained in the final film, even though silicon-methyl backbone species have been reduced during UV exposure.

TABLE 6

| Post treatment | Modulus - Best results | Dielectric constant |
| --- | --- | --- |
| Thermal | 7.7 | 2.8 |
| UV | 11.0 | 2.5 |

TABLE 7

| Post-treatment | Dielectric constant |
| --- | --- |
| DEMS-PCM films deposited by PECVD Recipe 1 targeting k = 2.3 film | |
| 2 hours 400 C. | 2.88 |
| 12 hours 400 C. | 2.83 |
| 30 minutes UV | 2.27 |
| DEMS-PCM films deposited by PECVD Recipe 2 targeting k = 2.5 film | |
| 2 hours 400 C. | 2.80 |
| 12 hours 400 C. | 2.84 |
| 30 min UV | 2.46 |

TABLE 8

| | $CH_x/SiO$ FT-IR signal | Contributions to $CH_x$ peak in FT-IR |
| --- | --- | --- |
| Grill single phase SiCOH film | 0.02 | Silicon methyl backbone |
| Grill multi phase SiCOH film | 0.40 | $CH_x$ third phase + silicon methyl backbone |
| APCI single phase SiCOH film | 0.02-0.03 | Silicon methyl backbone |
| APCI DEMS-paracymene porous film | 0.01-0.03 | Silicon methyl backbone |
| Amorphous carbon | 0 | No signal |

Example 3g

In comparative example U.S. Pat. No. 6,312,793, Grill presents formation of high carbon content SiCOH films through formation of a three phase composite, where the first phase is an SiCOH network, the second phase is $CH_x$, and the third phase is porosity. The $CH_x$ phase in these films is clearly evident through FT-IR analysis of the hydrocarbon peak at ~3000 wavenumbers. In Grill, this peak is 20 times greater for the three phase film compared to a single phase film. The peak at ~3000 wavenumbers reflects signal from the silicon methyl backbone functionality, in addition to any organic $CH_x$ present in the film. In the single phase film, there is no organic source (porogen) in the deposition, therefore the $CH_x$ FT-IR peak reflects only contribution from the silicon methyl backbone. Therefore, films from the present invention are also tabulated in Table 8 for comparison. It can be seen that the $CH_x$ values from DEMS-paracymene films are within the range observed for single phase SiCOH films. Unlike films disclosed by Grill, these DEMS-paracymene films do not contain a hydrogen rich third organic phase.

Not wishing to be bound by theory, the higher total carbon content (for example as determined by XPS) in DEMS-paracymene films compared to films formed from other precursors may be due to the presence of amorphous elemental carbon, which is FT-IR transparent and non-hydrogen containing (Table 8). An example FT-IR spectrum for DEMS-paracymene film after UV exposure is plotted in FIG. 9.

The present invention has been set forth with regard to several preferred embodiments, but the scope of the present invention is considered to be broader than those embodiments and should be ascertained from the claims below.

The invention claimed is:

1. A chemical vapor deposition method for producing a porous organosilica glass film represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %, said method comprising:

providing a substrate within a vacuum chamber;

introducing into the vacuum chamber gaseous reagents including at least one precursor selected from the group consisting of an organosilane and an organosiloxane, and a porogen that is distinct from the precursor, wherein the porogen represented by the formula:

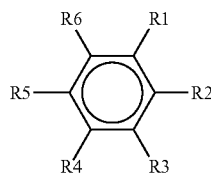

where R1-R6 are independently selected from the group consisting of: H; OH; $C_1$ to $C_6$ linear, branched, cyclic, saturated, singly or multiply unsaturated, hydrocarbon; and $C_1$ to $C_6$ linear, branched, cyclic, saturated or multiple unsaturated, ether, epoxide, alcohol, and ketone;

applying energy to the gaseous reagents in the vacuum chamber to induce reaction of the gaseous reagents to deposit a preliminary film on the substrate, wherein the preliminary film contains the porogen; and removing from the preliminary film a portion of the porogen using ultra-violet exposure, to provide the porous film with pores and a dielectric constant less than 2.6.

2. The method of claim 1 wherein the dielectric constant is less than 2.2.

3. The method of claim 1 wherein v is from 20 to 30 atomic %, w is from 20 to 45 atomic %, x is from 5 to 20 atomic %, y is from 15 to 40 atomic % and z is 0.

4. The method of claim 1 wherein the energy is plasma energy.

5. The method of claim 1 wherein most of the hydrogen in the porous film is bonded to carbon.

6. The method of claim 1 wherein the porous film has a density less than 1.5 g/ml.

7. The method of claim 1 wherein the pores have an equivalent spherical diameter less than or equal to 5 nm.

8. The method of claim 1 wherein a Fourier transform infrared (FTIR) spectrum of the porous film is substantially identical to a reference FTIR of a reference film prepared by a process substantially identical to the method except for a lack of porogen precursor.

9. The method of claim 1 wherein the porous film has an average weight loss of less than 1.0 wt %/hr isothermal at 425° C. under $N_2$.

10. The method of claim 1 wherein the porous film has an average weight loss of less than 1.0 wt %/hr isothermal at 425° C. under air.

11. The method of claim 1 wherein the porogen is selected from the group consisting of: tolubenzene, xylene, phenol, mesitylene, ethyl benzene, styrene, ethoxybenzene, methoxybenzene, benzaldehyde.

12. The method of claim 1 wherein the porogen is toluene.

13. The method of claim 1 wherein the porogen is cymene.

14. The method of claim 1, wherein the organosiloxane is diethoxymethylsilane.

15. The method of claim 1, wherein the at least one precursor is represented by:

(a) the formula $R^1_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3;

(b) the formula $R^1_n(OR^2)_p(O(O)CR^4)_{3-n-p}Si—O—SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(c) the formula $R^1_n(OR^2)_p(O(O)CR^4)_{3-n-p}Si—SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

(d) the formula $R^1_n(OR^2)_p(O(O)CR^4)_{3-n-p}Si—R^7—SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3, and m+q≤3;

(e) the formula $(R^1_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, provided that n+p≤4;

(f) the formula $(R^1_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, provided that n+p≤4; or (g) cyclic carbosilanes of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated, and x is an integer from 2 to 8.

16. The method of claim 15, wherein the at least one precursor is a member selected from the group consisting of diethoxymethylsilane, dim ethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, and tetraethoxysilane.

17. The method of claim 1, wherein said at least one precursor is a mixture of a first organosilicon precursor with two or fewer Si—O bonds with a second organosilicon precursor with three or more Si—O bonds, and the mixture is provided to tailor a chemical composition of the porous film.

18. The method of claim 1 wherein the gaseous reagents include a mixture of diethoxymethylsilane and tetraethoxysilane.

19. A composition comprising:
(a)(i) at least one precursor selected from the group consisting of diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, and tetraethoxysilane, trimethylsilane, tetramethylsilane, diethoxymethylsilane, dimethoxymethylsilane, ditertiarybutoxymethylsilane, methyltriethoxysilane, dimethyldimethoxysilane, dimethyldiethoxysilane, methyltriacetoxysilane, methyldiacetoxysilane, methylethoxydisiloxane, dimethyldiacetoxysilane, bis(trimethoxysilyl)methane, bis(dimethoxysilyl)methane, tetraethoxysilane, triethoxysilane, and mixtures thereof; and
(ii) a porogen distinct from the at least one precursor, said porogen being a member selected from the group consisting of toluene, benzene, cymene, xylene, phenol, mesitylene, ethyl benzene, styrene, ethoxybenzene, methoxybenzene, and benzaldehyde.

20. The composition of claim 19 wherein the at least one silicon precursor is diethoxymethylsilane and the at least one porogen is cymene.

21. The composition of claim 20 wherein at least one of the vessels is a pressurizable stainless steel vessel.

22. The composition of claim 20 wherein the porogen and the precursor are maintained in a single vessel having a separation means for maintaining the porogens and the precursor separate.

23. The composition of claim 19 provided in a kit, wherein the porogen and the precursor are maintained in separate vessels.

* * * * *